US007776727B2

(12) United States Patent
Borden

(10) Patent No.: US 7,776,727 B2
(45) Date of Patent: Aug. 17, 2010

(54) METHODS OF EMITTER FORMATION IN SOLAR CELLS

(75) Inventor: Peter Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/202,213

(22) Filed: Aug. 29, 2008

(65) Prior Publication Data
US 2009/0068783 A1 Mar. 12, 2009

Related U.S. Application Data

(60) Provisional application No. 60/969,583, filed on Aug. 31, 2007.

(51) Int. Cl.
*H01L 21/04* (2006.01)
(52) U.S. Cl. .............................. 438/510; 257/E21.135
(58) Field of Classification Search .................... 438/20, 438/57, 254, 510; 136/254
See application file for complete search history.

(56) References Cited

U.S. PATENT DOCUMENTS

| 4,910,160 A * | 3/1990 | Jennings et al. ............... 438/17 |
| 5,532,175 A | 7/1996 | Racanelli et al. |
| 5,907,181 A * | 5/1999 | Han et al. .................... 257/630 |
| 5,965,929 A * | 10/1999 | Gnannt et al. ................ 257/565 |
| 2005/0014314 A1* | 1/2005 | Dokumaci et al. ........... 438/151 |
| 2006/0099830 A1* | 5/2006 | Walther et al. .............. 438/790 |
| 2006/0237809 A1 | 10/2006 | Bhattacharyya |
| 2007/0176124 A1 | 8/2007 | Sasaki et al. |

OTHER PUBLICATIONS

International Search Report and Written Opinion dated Nov. 13, 2008 for PCT/US 08/74929 (012705 PCP).

* cited by examiner

*Primary Examiner*—W. David Coleman
*Assistant Examiner*—Christine Enad
(74) *Attorney, Agent, or Firm*—Patterson & Sheridan, LLP

(57) ABSTRACT

Embodiments of the invention contemplate high efficiency emitters in solar cells and novel methods for forming the same. One embodiment of the improved emitter structure, called a high-low type emitter, optimizes the solar cell performance by equally providing low contact resistance to minimize ohmic losses and isolation of the high surface recombination metal-semiconductor interface from the junction to maximize cell voltage. Another embodiment, called an alternating doping type emitter, provides regions of alternating doping type for use with point contacts in the back-contact solar cells. One embodiment of the methods includes depositing and patterning a doped or undoped dielectric layer on a surface of a substrate, implanting a fast-diffusing dopant and/or a slow-diffusing dopant into the substrate either simultaneously or sequentially, and annealing the substrate to drive in the dopants. Another embodiment of the methods includes using a physical mask to form a patterned dopant distribution in a substrate.

30 Claims, 11 Drawing Sheets

METHODS OF EMITTER FORMATION IN SOLAR CELLS

CROSS-REFERENCE TO RELATED APPLICATIONS

This application claims the benefit of U.S. Provisional Patent Application Ser. No. 60/969,583, filed Aug. 31, 2007, which is herein incorporated by reference in its entirety.

BACKGROUND OF THE INVENTION

1. Field of the Invention

Embodiments of the present invention generally relate to solar/photovoltaic cells and the method of forming selective emitters for the same.

2. Description of the Related Art

Solar or photovoltaic cells are material junction devices which convert sunlight into direct current (DC) electrical power. When exposed to sunlight (consisting of energy from photons), the electric field of solar cell p-n junction separates pairs of free electrons and holes, thus generating a photo-voltage. A circuit from p-side to n-side allows the flow of electrons when the solar cell is connected to an electrical load, while the area and other parameters of the SOLAR cell junction device determine the available current.

Currently, solar cells and panels are manufactured by starting with many small silicon sheets or wafers as material units and processing them into individual solar cells before they are assembled into modules and panels. These silicon sheets are generally saw-cut p-type boron doped silicon sheets, precut to the sizes and dimensions that will be used. The cutting (sawing) or ribbon formation operation on the silicon sheets damages the surfaces of the precut silicon sheets to some degree, and etching processes are performed on both surfaces of the silicon sheets to remove a thin layer of material from each surface and provide textures thereon.

P-N junctions, a critical component of emitters, are then formed by diffusing or implanting an n-type dopant into the precut p-type silicon substrate. Phosphorus is widely used as the n-type dopant for silicon in solar cells. One example of phosphorus diffusion process includes coating phosphosilicate glass compounds onto the surface of the silicon sheets and performing diffusion/annealing inside a furnace. Another example includes bubbling nitrogen gas through liquid phosphorus oxychloride (POCl3) sources which are injected into an enclosed quartz furnace loaded with batch-type quartz boats containing the silicon sheets.

Following emitter formation, one or both surfaces of the solar cell can also be coated with suitable dielectrics. Dielectric layers are used to minimize surface charge carrier recombination and some dielectric materials, such as silicon oxide, titanium oxide, or silicon nitride, can be provided as antireflective coating to reduce reflection losses of photons.

The front or sun facing side of the solar cell is then covered with an area-minimized metallic contact grid for transporting current and minimizing current losses due to resistance through silicon-containing layers. Some blockage of sunlight or photons by the contact grid is unavoidable but can be minimized. The bottom of the solar cell is generally covered with a back metal which provides contact for good conduction as well as high reflectivity. Metal grids with patterns of conductive metal lines are used to collect current. Generally, screen printing thick-film technology is used in the solar cell industry to layer a conductive paste of metal materials, e.g., silver, etc., into a desired pattern and deposit a metal material layer to the surface of the silicon sheets or substrates for forming metal contact fingers or wiring channels on the front and/or back side of the solar cell. Other thin film technologies may be used for contact formation or electrode processing. The deposited metal layer, formed into contacts, is often dried and then fired or sintered at high temperature to form into good conductors in direct contact with underlying silicon materials, and a single solar cell is made. Generally, both silver and aluminum are contained in the screen printing paste for forming back side contacts with good conductor contact to silicon material and easy soldering.

Manufacturing high efficiency solar cells at low cost (providing low unit cost per Watt) is the key to making solar cells more competitive in the generation of electricity for mass consumption. Even small improvements in cost per Watt substantially increase the size of the available market. Therefore, there exists a need for a cost effective method of forming emitters to improve the efficiency of a solar cell in generating and maintaining electron-hole pairs from absorbed photons in the emitters and the efficiency of driving the electrons and holes through the external electrical circuit with a load.

SUMMARY OF THE INVENTION

The present invention generally provides a method of forming a solar cell device, comprising disposing a first amount of a first dopant within a region of a substrate, disposing a second amount of a second dopant within the region of the substrate after disposing the first dopant within the region, wherein the first dopant has a higher atomic mass than the second dopant, and heating the substrate so that the first dopant diffuses a first depth within the substrate and the second dopant diffuses a second depth into the substrate, wherein the second depth is deeper than the first depth.

The present invention also provides a method of forming a solar cell device, comprising forming a dielectric layer on a surface of a substrate, removing a portion of the dielectric layer from the surface to expose a portion of the substrate, disposing a first amount of a first dopant within a region of the substrate which is adjacent to the exposed portion of the substrate, disposing a second amount of a second dopant within the region of the substrate, and heating the substrate to cause the first dopant to diffuse a first depth within the substrate and the second dopant to diffuse a second depth within the substrate, wherein the second depth is greater than the first depth.

The present invention also provides a method of forming a solar cell device, comprising positioning a mask over a surface of a substrate, disposing a first dopant into a first region of the substrate through an opening formed in the mask, disposing a second dopant into the region of the substrate through the opening formed in the mask, heating the substrate to form a second region and a third region, wherein the concentration of the first dopant in the second region is greater than the second dopant concentration, and the concentration of the second dopant in the third region is greater than the first dopant concentration, and the second region is closer to the surface of the substrate.

The present invention also provides a method of forming a solar cell device, comprising depositing a doped dielectric layer on a surface of a substrate, wherein the doped dielectric layer contains a first dopant material, removing a first region of the doped dielectric layer from the surface to expose a first portion of the substrate, disposing a second dopant material within the first region of the substrate which is adjacent to the surface of the substrate, heating the substrate to cause the first dopant material and the second dopant material to diffuse into the substrate; and removing a second region of the doped dielectric layer from the substrate to expose a second portion of the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention contemplate the formation of high efficiency solar cells and novel methods for forming the same. One embodiment of the solar cell and improved emitter structure, called a high-low type emitter, is created to optimize the solar cell performance by equally providing low contact resistance to minimize ohmic losses and isolation of the high surface recombination metal-semiconductor interface from the junction to maximize cell voltage. Another embodiment of the improved emitter structure, called an alternating doping type emitter, provides regions of alternating doping type for use with point contacts in the back-contact solar cells. One embodiment of the methods for forming an improved emitter structure includes depositing and patterning a layer of dielectric material on a surface of a solar cell substrate, implanting a fast-diffusing dopant and a slow-diffusing dopant into the substrate either simultaneously or sequentially, and annealing the substrate to drive in the dopants deeper into the substrate. In one embodiment, the dielectric material includes silicon oxide, silicon nitride, silicon carbide, and aluminum oxide individually or in combination. In one embodiment, the fast-diffusing dopants include boron (B) and phosphorous (P), and the slow-diffusing dopants include arsenic (As). The slow-diffusing dopant species often have a higher atomic mass than the fast-diffusing dopant species. Another embodiment of the methods for forming an improved emitter structure includes using a physical hard mask to form a patterned dopant distribution in a solar cell substrate using a plasma doping process. In another embodiment of the methods for forming an improved emitter structure, a doped dielectric layer is deposited and then annealed to have the embedded dopant driven into the substrate. Generally, solar cell substrates that may benefit from the invention include substrates containing organic material, single crystal silicon, multi-crystalline silicon, polycrystalline silicon, germanium (Ge), gallium arsenide (GaAs), cadmium telluride (CdTe), cadmium sulfide (CdS), copper indium gallium selenide (CIGS), copper indium selenide (CuInSe2), and gallium indium phosphide (GaInP2) that are used to convert sunlight to electrical power.

Emitter Formation Using Screen Dielectric

Figure 1A:
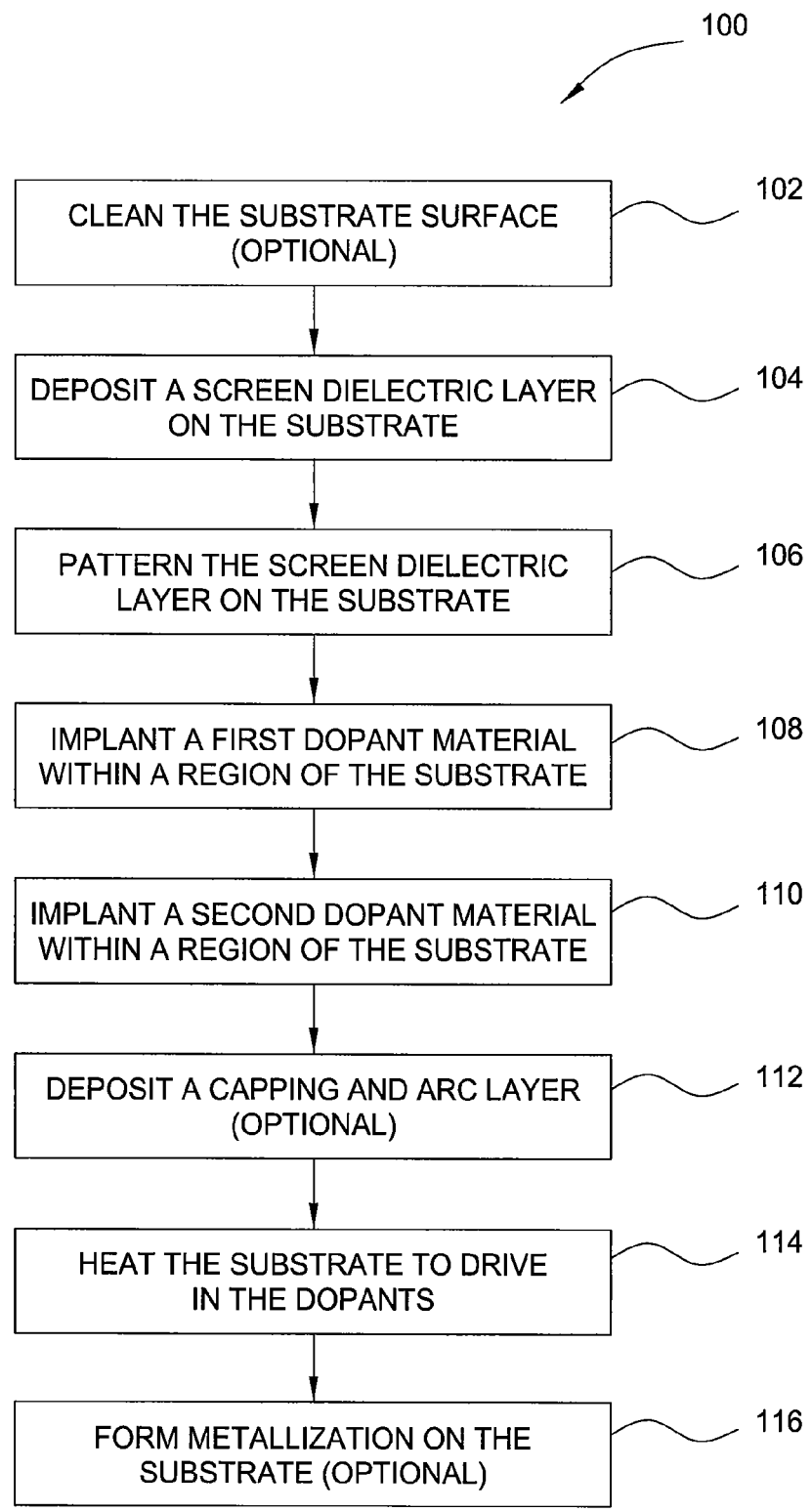
FIGS. 1A-1B illustrate a process sequence used to form high-low type emitters or alternating doping type emitters in a solar cell using a patterned screen dielectric layer as a mask according to one embodiment of the invention.
Figure 1B:
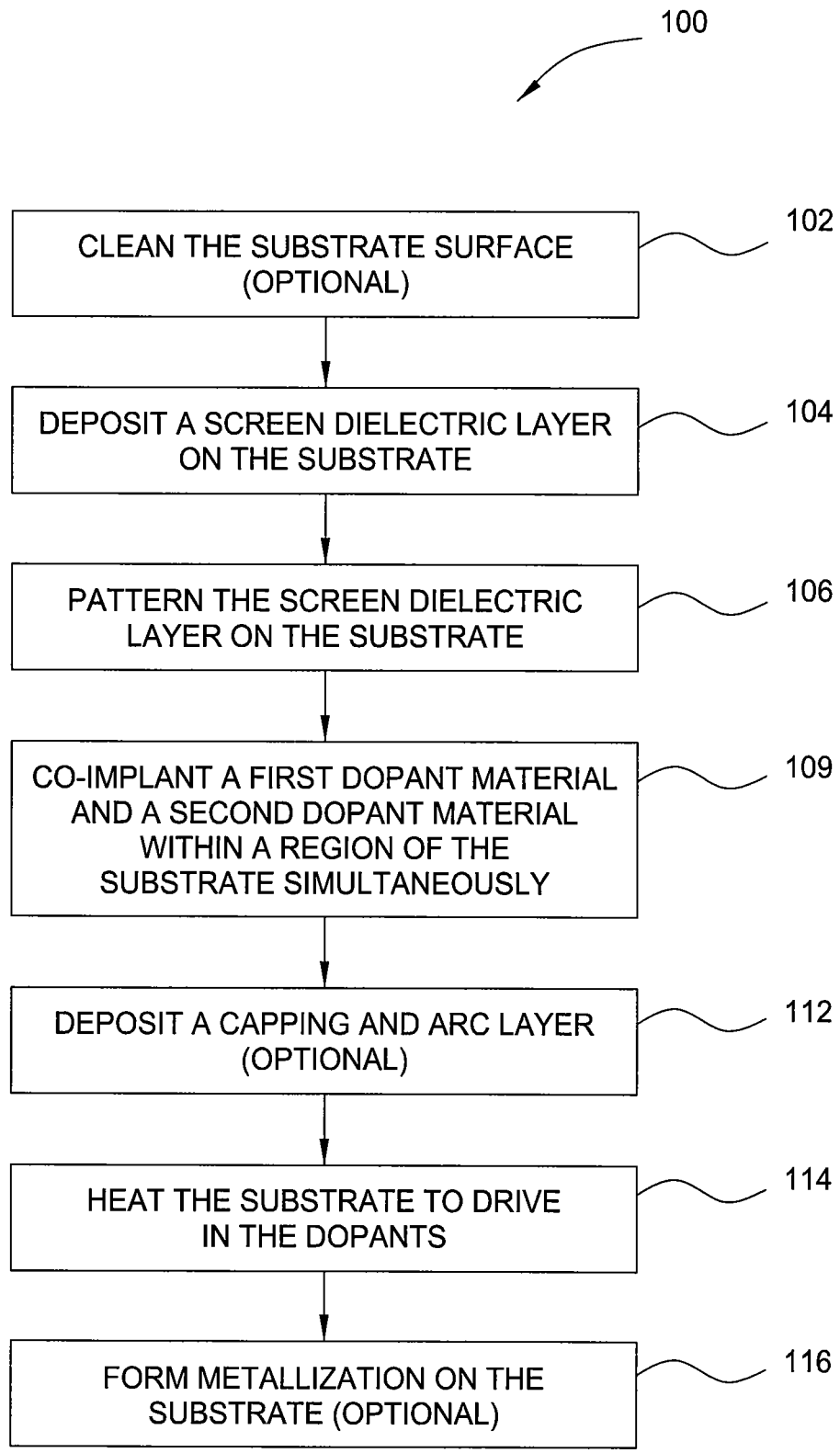

FIGS. 1A-1B illustrate a process sequence 100 used to form high-low type emitters or alternating doping type emitters in a solar cell using a patterned screen dielectric layer as a mask. FIGS. 2A-2F illustrate schematic cross-sectional views of a solar cell substrate 202 during different stages in the process sequence 100 depicted in FIGS. 1A-1B. It should be noted that the number and sequence of steps illustrated in FIGS. 1A-1B and 2A-2F are not intended to be limiting as to the scope of the invention described herein, since one or more steps can be added, deleted and/or reordered without deviating from the basic scope of the invention described herein.

Figure 2A:
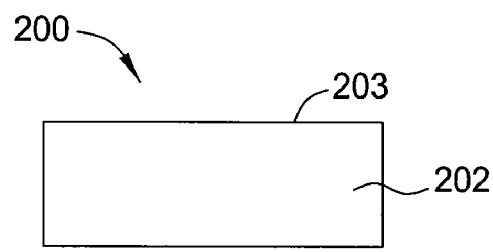
FIGS. 2A-2F illustrate schematic cross-sectional views of a solar cell substrate during different stages in the process sequence depicted in FIGS. 1A-1B according to one embodiment of the invention.

At step 102, as shown in FIGS. 1A and 2A, the surfaces of a solar cell substrate 202 are cleaned to remove any undesirable material or roughness. In one embodiment, the solar cell substrate 202 is formed from a crystalline silicon material. In one embodiment, the clean process may be performed using a batch cleaning process in which the substrates are exposed to a cleaning solution. In one embodiment, the substrates are wetted by spraying, flooding, immersing of other suitable technique. The clean solution may be an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning solution. The cleaning process may be performed on the substrate between about 5 seconds and about 1800 seconds, such as about 30 seconds to about 240 seconds, for example about 120 seconds.

Figure 2B:
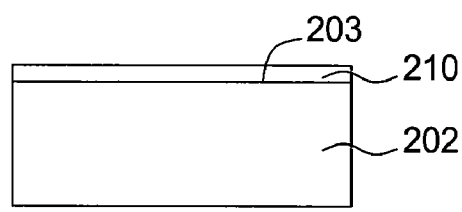

At step 104, as shown in FIGS. 1A and 2B, a dielectric layer, or specifically a screen dielectric layer, 210 is formed on a surface 203 of the solar cell substrate 202. The screen dielectric layer 210 may be formed using a conventional thermal oxidation process, such a furnace annealing process, a rapid thermal oxidation process, an atmospheric pressure or low pressure CVD process, a plasma enhanced CVD process, a PVD process, evaporation technique, or applied using a sprayed-on, spin-on, roll-on, screen printed, or other similar type of deposition process. In one embodiment, the solar cell substrate 202 is crystalline silicon, and the screen dielectric layer 210 is a silicon oxide layer that is between about 50 Å and about 3000 Å thick, for example about 300 Å. It should be noted that the discussion of the formation of a silicon oxide type screen dielectric layer is not intended to be limiting as to the scope of the invention described herein since the screen dielectric layer 210 could also be formed using any of the conventional deposition processes mentioned above and/or be made of other dielectric materials, for example, silicon carbide ($SiC_x$), silicon nitride ($SiN_x$), or aluminum oxide ($AlO_x$). In the embodiment of the process of forming a standard solar cell, or a high-low type solar cell, the surface 203 is the front, light-receiving surface of the solar cell substrate 202. In the embodiment of the process of forming a point contact solar cell, or an alternating doping type solar cell, the surface 203 is the back, non-light-receiving surface of the solar cell substrate 202.

Figure 2C:
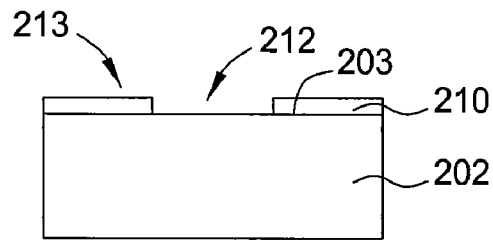

At step 106, as shown in FIGS. 1A and 2C, the screen dielectric layer 210 formed on the surface 203 of the solar cell substrate 202 is patterned and then a portion is removed, or etched, by conventional means to form a desired pattern of exposed regions 212 of the substrate that can be used to define the contacting regions for the metallization to form contacts. In one embodiment, pattern of exposed regions 212 in the screen dielectric layer 210 include alternating bar shaped regions that are 100-500 µm wide and holes that are a few tens of microns in diameter and about 500 µm apart. Typical etching processes that may be used to form the exposed regions 212 may include but are not limited to patterning and dry etching techniques, laser ablation techniques, patterning and wet etching techniques, or other similar processes that may be used to form a desired pattern in the screen dielectric layer 210. In one embodiment, an etchant material is selectively deposited on the screen dielectric layer 210 by use of a conventional ink jet printing, screen printing, or other similar process to form and define the desired exposed regions 212 where the contacts are to be formed.

Figure 2D:
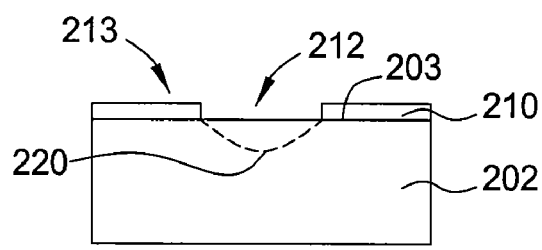

At step 108, as shown in FIGS. 1A and 2D, a first dopant is implanted onto the surface 203 to form a doped region 220 within the solar cell substrate 202. In one embodiment, the first dopant is a slow-diffusing dopant. In this case, a slow-diffusing dopant is intentionally implanted prior to a fast-diffusing dopant in order to amorphize the crystalline structure of the solar cell substrate 202 to minimize channeling of the fast-diffusing dopant during implant, although both may be co-implanted. In one embodiment, arsenic (As), an n-type slow-diffusing dopant, is implanted onto the surface 203 of a p-type silicon solar cell substrate 202 to form a n-type doped region 220 that is heavily doped using a plasma ion immersion implantation (P3I) system available from Applied Materials, Inc., of Santa Clara, Calif. One advantage of using a plasma ion immersion implantation process is the ability to achieve high dosing levels in a short implant time. Unlike most beam-line ion implanters, the wafers sit on an electrical biased horizontal chuck, so many wafers can be implanted in a few seconds. An example of a processing chamber that may be adapted to perform a plasma ion immersion type process is further described below in conjunction with FIG. 9.

In one embodiment, the heavily doped n-type doped region 220 that is heavily doped is used to make a low resistance contact with the metallization on top (not shown in FIG. 2D). In one embodiment, the heavily doped n-type doped region 220 forms less than 1% of the area of the surface 203. In one example, arsenic is implanted with a dose, or amount, of about $1\times10^{16}/cm^2$ and energy of about 3000 eV, approximately equivalent to a 500 eV beam line implant, to reach a dopant distribution centered at a peak depth of about 40 Å in the exposed regions 212. In the regions 213 covered by the screen dielectric layer 210 that is thick enough to block and trap the arsenic dopant material in the screen dielectric layer 210 so that it generally will not reach the solar cell substrate 202 during the implant process or subsequent process steps. In one embodiment, the arsenic precursor used in the P3I implant is $AsH_3$ or other similar material.

Figure 2E:
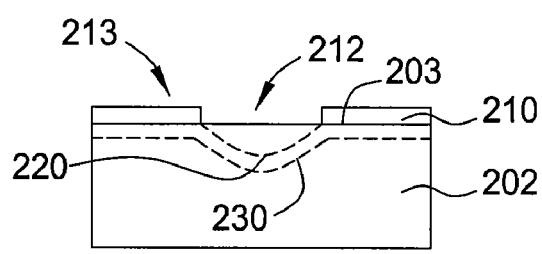

At step 110, as shown in FIGS. 1A and 2E, a second dopant is implanted onto the surface 203 to form a doped region 230 within the solar cell substrate 202. In one embodiment, the second dopant is a fast-diffusing dopant. By controlling the implant process parameters the depth of the fast-diffusing doped region 230 can be configured to extend deeper into the solar cell substrate 202 than the depth of the slow-diffusing doped region 220. In one embodiment, phosphorous (P), an n-type fast-diffusing dopant, is implanted onto the surface 203 of the p-type silicon solar cell substrate 202 to form a lightly doped n-type region 230 using a plasma ion immersion implantation (P3I) system. In this case, after performing steps 102-110, the lightly doped n-type region forms a deep p-n junction with the p-type solar cell substrate 202. The heavily doped n-type doped region 220 combined with the lightly doped n-type region 230 can be used to form a high-low type emitter structure, which provides both a low contact resistance to the metallization and a two-step p-n junction to prevent excessive carrier recombination. Process sequence 100 enables formation of high-low doping regions using only one patterning step according to one embodiment. In one embodiment, while the screen dielectric layer 210 blocks and traps the slow-diffusing dopant (i.e. arsenic), it still allows the fast-diffusing dopant (i.e. phosphorous) to penetrate the solar cell substrate 202, and the degree of penetration generally depends on parameters including implant energy and thickness of the screen dielectric layer 210. In another embodiment, the fast-diffusing dopant (i.e. phosphorous) could be trapped in the screen dielectric layer 210 during implant, but later diffuses into the solar cell substrate 202 during anneal (step 114). This process thus removes the need for an additional patterning step for the fast-diffusing dopant. In one example, phosphorous is implanted with a dose, or amount, of about $1\times10^{14}/cm^2$ and energy of about 3000 eV to reach a dopant distribution centered at a peak depth of about 50 Å in the exposed regions 212. In one embodiment, the phosphorous precursor used in the P3I implant is phosphine ($PH_3$), or other similar material.

In an alternate embodiment of the process performed at step 110, for the purpose of forming point contacts in a back-contact solar cell, boron (B), a p-type fast-diffusing dopant, is implanted onto the surface 203 of the p-type solar cell substrate 202 to form a p-type region 230 using a plasma ion immersion implantation (P3I) system. In this case, the p-type region 230 and the n-type doped region 220 (depicted in Step 108) are opposite doping types and can be used to form an alternating doping type emitter structure, which is the preferred emitter structure for making point contacts in the back-contact solar cells. This alternate version of the process sequence 100 enables formation of alternating doping regions using only one patterning step because according to one embodiment. In one embodiment, while the screen dielectric layer 210 blocks and traps the slow-diffusing dopant (i.e. arsenic), it still allows the fast-diffusing dopant (i.e. boron) to penetrate the solar cell substrate 202, and the degree of penetration generally depends on parameters including implant energy and thickness of the screen dielectric layer 210. In another embodiment, the fast-diffusing dopant (i.e. boron) could be trapped in the screen dielectric layer 210 during implant, but later diffuses into the solar cell substrate 202 during anneal (step 114). This process thus removes the need for an additional patterning step for the fast-diffusing dopant. In one example, boron is implanted with a dose, or amount, of about $1 \times 10^{14}/cm^2$ and energy of about 500 eV to reach a dopant distribution centered at a peak depth of about 40 Å in the exposed regions 212. In one embodiment, the boron precursor used in the P3I implant is $BF_3$ or $B_2H_6$. In one embodiment, $B_2H_6$ may be preferred for solar cell application since the hydrogen from $B_2H_6$ helps passivate the surface 203 of the silicon solar cell substrate 202 by bonding with the silicon dangling bonds.

At step 112, as shown in FIG. 1A, an optional capping layer (not shown in FIG. 2E) can be deposited on the surface 203 of the solar cell substrate 202 to prevent loss of dopant from the doped regions during a subsequent annealing step. In one embodiment, the capping layer is composed of $Si_3N_4$, which can also be used as an anti-reflective coating, and can be deposited by any conventional process, such as an atmospheric pressure or low pressure CVD process, a plasma enhanced CVD process, or a PVD process.

Figure 2F:
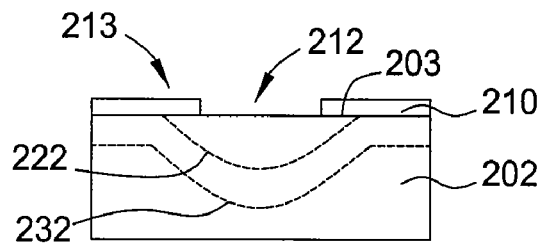

At step 114, as shown in FIGS. 1A and 2F, the solar cell substrate 202 is annealed, or heated, to a temperature greater than about 800° C. to activate the dopants and drive the dopants deeper into the solar cell substrate 202 to reach the desired regions 222 and 232. Operating parameters, such as duration and temperature of the anneal process, can be adjusted to achieve the desired profiles of the regions 222 and 232. The fast-diffusing dopant generally diffuses to a deeper depth than the slow-diffusing dopant. In one embodiment, annealing is performed in a rapid thermal anneal (RTA) system available from Applied Materials, Inc., of Santa Clara, Calif. at about 1050° C. for about 20-30 seconds. In one embodiment, annealing is performed in a furnace tube at about 850° C. for about 30 minutes.

At step 116, as shown in FIG. 1A, an optional patterned metallization layer (not shown in FIG. 2F) is deposited on the surface 203 of the solar cell substrate 202 to form buss lines that electrically connect the emitters via the exposed regions 212. In one embodiment, the metallization layer is between about 2000 and about 50,000 Å thick and contains a metal, such as copper (Cu), silver (Ag), gold (Au), tin (Sn), cobalt (Co), rhenium (Rh), nickel (Ni), zinc (Zn), lead (Pb), palladium (Pd), tungsten (W), titanium (Ti), tantalum (Ta), molybdenum (Mo) and/or aluminum (Al). In one embodiment, the metallization layer can be patterned by use of a conventional ink jet printing, rubber stamping, screen printing, or other similar process.

Following the metallization process at step 116, individual solar cells are often electrically connected and encapsulated as a solar module. Solar modules often have a sheet of glass on the front (i.e. light receiving) side, allowing light to pass while protecting the semiconductor wafers from the elements. Solar cells are usually connected in series in modules to create an additive voltage while connecting cells in parallel will yield a higher current. Solar modules are then interconnected, in series or parallel, or both, to create a solar array with the desired peak DC voltage and current.

Emitter Formation Using Screen Dielectric and Dopant Co-Implant

To reduce manufacturing steps in the process sequence 100 and the associated cost, the process steps 108 and 110 can be replaced with step 109 (FIG. 1B) in which more than one dopant species is co-implanted at the same time. In one embodiment, at step 109, the first dopant and the second dopant can be co-implanted in one step onto the surface 203 of the solar cell substrate 202. In one embodiment, the concentration of each dopant may be separately controlled through setting of the pressure of the dopant gas in a plasma ion immersion implantation (P3I) system. In the embodiment of forming high-low type emitters, slow-diffusing arsenic is implanted with a dose of about $1 \times 10^{16}/cm^2$, and fast-diffusing phosphorous is implanted with a dose of about $1 \times 10^{14}/cm^2$. In the embodiment of forming alternating doping type emitters, slow-diffusing arsenic is implanted with a dose of about $1 \times 10^{16}/cm^2$, and fast-diffusing boron is implanted with a dose of about $1 \times 10^{14}/cm^2$.

Following the co-implant step at step 109, the same process steps 112, 114, and 116 as described above will be performed.

Emitter Formation Using Physical Mask

Figure 3A:
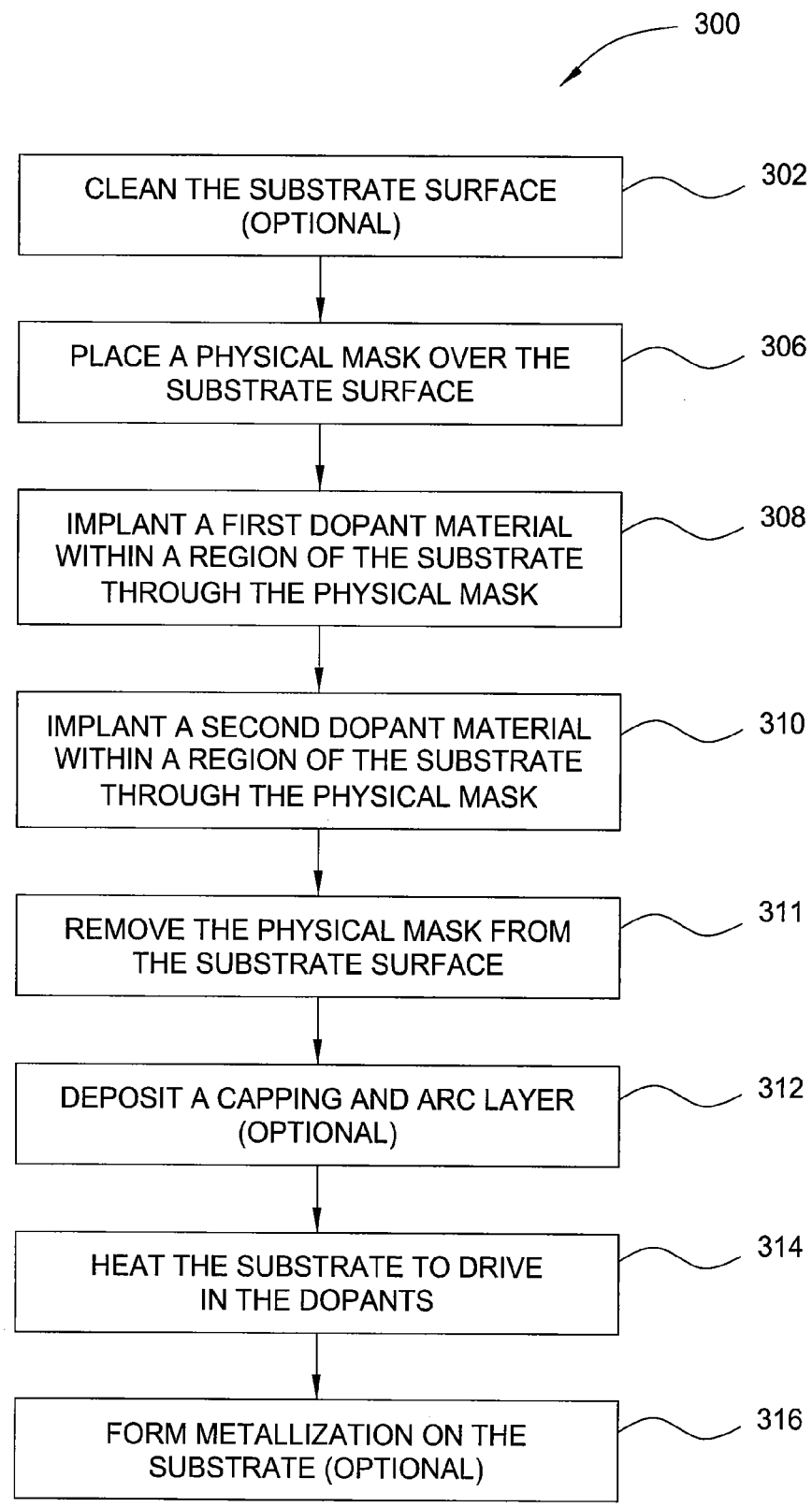
FIGS. 3A-3B illustrate a process sequence used to form high-low type emitters or alternating doping type emitters in a solar cell using a physical mask to define the doping regions according to one embodiment of the invention.
Figure 3B:
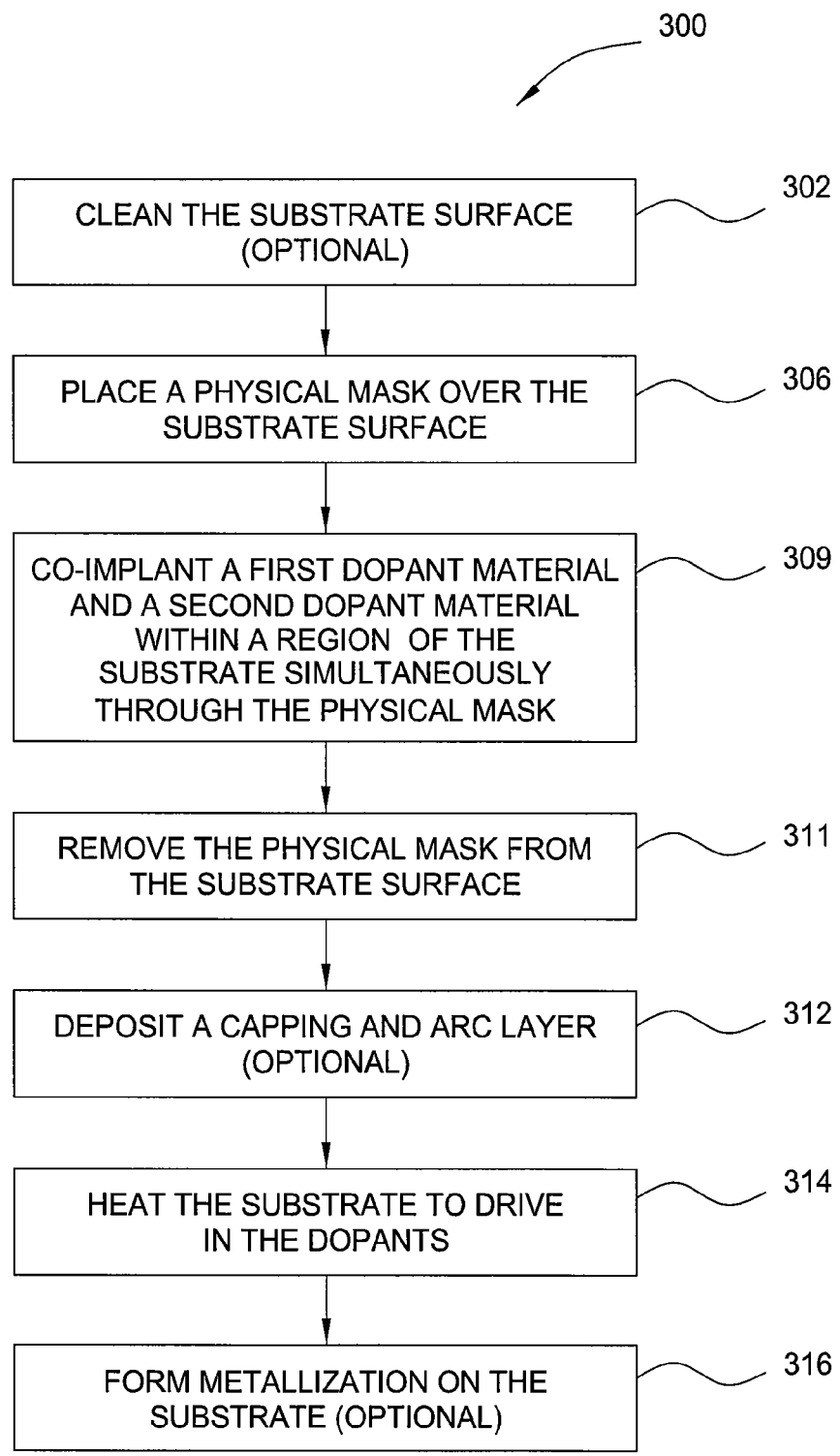

FIGS. 3A-3B illustrate a process sequence 300 used to form high-low type emitters or alternating doping type emitters in a solar cell using a physical mask to define the doping regions. FIGS. 4A-4F illustrate schematic cross-sectional views of a solar cell substrate 202 during different stages in the process sequence 300 depicted in FIGS. 3A-3B. It should be noted that the number and sequence of steps illustrated in FIGS. 3A-3B and 4A-4F are not intended to be limiting as to the scope of the invention described herein, since one or more steps can be added, deleted and/or reordered without deviating from the basic scope of the invention described herein.

In one embodiment, the processes formed at steps 302, 312, 314, and 316 of FIG. 3 are the same or similar to the processes performed at steps 102, 112, 114, and 116 of FIG. 1, respectively. Therefore, at step 302 a process similar to step 102, discussed above, is performed on the solar cell substrate 402. In one embodiment, the solar cell substrate 402 is a crystalline silicon substrate similar to the solar cell substrate 202 discussed above.

Figure 4A:
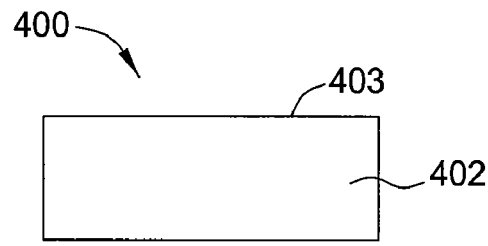
FIG. 4A-4F illustrate schematic cross-sectional views of a solar cell substrate during different stages in the process sequence depicted in FIG. 3 according to one embodiment of the invention.
Figure 4B:
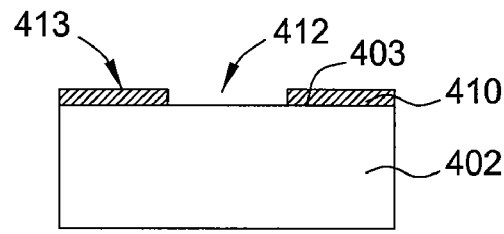

At step 306, as shown in FIGS. 3A and 4B, a physical mask 410 with openings 412 is placed over a surface 203 of the solar cell substrate 202. The openings 412 in the physical mask 410 define the desired doping regions and contacting regions for the metallization to form contacts. In one embodiment, patterns of the physical mask 410 include alternating bar shaped regions that are about 100-500 μm wide and holes that are a few tens of microns in diameter and about 500 μm apart. In one embodiment, the physical mask 410 is made out of silicon and patterned using common micro-machining techniques (e.g. through-hole etching or laser drilling). As an advantage, silicon is non-contaminating and conductive which prevents electrical charging. In one embodiment, the mask 410 is spaced about 1 mm above the solar cell substrate 402 with lift pins, and can be lifted to facilitate loading and unloading of the substrate.

Figure 4C:
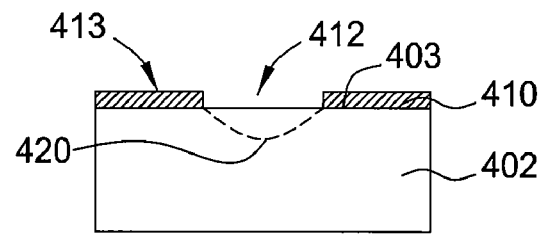

At step 308, as shown in FIGS. 3A and 4C, a first dopant is implanted through the openings 412 of the physical mask 410 onto the surface 403 to form a doped region 420 within the solar cell substrate 402. In one embodiment, the first dopant is a slow-diffusing dopant. In this case, a slow-diffusing dopant is intentionally implanted prior to a fast-diffusing dopant in order to amorphize the crystalline structure of the solar cell substrate 402 to minimize channeling of the fast-diffusing dopant during implant. In one embodiment, arsenic (As), an n-type slow-diffusing dopant, is implanted through the openings 412 of the physical mask 410 onto a surface 403 of a p-type silicon solar cell substrate 402 to form a heavily doped n-type doped region 420 using a plasma ion immersion implantation (P3I) system. In one embodiment, the heavily doped n-type doped region 420 is used to make a low resistance contact with the metallization on top (not shown in FIG. 4C). In one embodiment, the heavily doped n-type doped region 420 forms less than 1% of the surface area 403. In one example, arsenic is implanted with a dose, or amount, of about $1 \times 10^{16}/cm^2$ and energy of about 3000 eV, approximately equivalent to a 500 eV beam line implant, to reach a dopant distribution centered at a peak depth of 40 Å. In the regions 413 covered by the physical mask 410, arsenic generally will not reach the solar cell substrate 402 during the implant process or subsequent process steps. In one embodiment, the arsenic precursor used in the P3I implant is $AsH_3$, or other similar material.

Figure 4D:
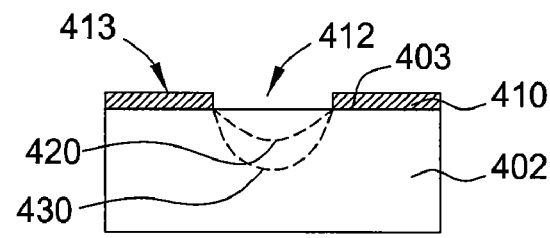

At step 310, as shown in FIGS. 3A and 4D, a second dopant is implanted through the openings 412 of the physical mask 410 onto the surface 403 to form a doped region 430 within the solar cell substrate 402. In one embodiment, the second dopant is a fast-diffusing dopant. By controlling the implant process parameters the depth of the fast-diffusing doped region 430 can be configured to extend deeper into the solar cell substrate 402 than the depth of the slow-diffusing doped region 420. In one embodiment, phosphorous (P), an n-type fast-diffusing dopant, is implanted through the openings 412 of the physical mask 410 onto the surface 403 of the p-type silicon solar cell substrate 402 to form a lightly doped n-type doped region 430 using a plasma ion immersion implantation (P3I) system. In this case, after performing steps 302-310, the lightly doped n-type doped region 430 forms a deep p-n junction with the p-type silicon solar cell substrate 402. The heavily doped n-type doped region 420 combined with the lightly doped n-type doped region 430 can be used to form a high-low type emitter structure, which provides both a low contact resistance to the metallization and a two-step p-n junction to prevent excessive carrier recombination. Process sequence 300 utilizes the difference in diffusion rate between the slow and fast diffusing dopants to enable formation of high-low doping regions using only one patterning step. In one example, phosphorous is implanted with a dose, or amount, of about $1 \times 10^{14}/cm^2$ and energy of about 3000 eV to reach a dopant distribution centered at a peak depth of about 50 Å in the openings 412. In the regions 413 covered by the physical mask 410, phosphorous cannot reach the solar cell substrate 402 during the implant process or subsequent process steps. In one embodiment, the phosphorous precursor used in the P3I implant is phosphine ($PH_3$) or other similar material.

In an alternate embodiment of the process performed at step 310, for the purpose of forming point contacts in a back-contact solar cell, boron (B), a p-type fast-diffusing dopant, is implanted through the openings 412 of the physical mask 410 onto the surface 403 of the p-type silicon solar cell substrate 402 to form a p-type doped region 430 using a plasma ion immersion implantation (P3I) system. In this case, the p-type doped region 430 and the n-type doped region 420 (depicted in step 308) are opposite doping types and can be used to form an alternating doping type emitter structure, which is the preferred emitter structure for making point contacts in the back-contact solar cells. This alternate version of the process sequence 300 utilizes the difference in diffusion rate between the slow and fast diffusing dopants to enable formation of alternating doping regions using only one patterning step. In one example, boron is implanted with a dose, or amount, of about $1 \times 10^{14}/cm^2$ and energy of about 500 eV to reach a dopant distribution centered at a peak depth of 40 Å in the openings 412. In the regions 413 covered by the physical mask 410, boron cannot reach the silicon solar cell substrate 402 during the implant process or subsequent process steps. In one embodiment, the boron precursor used in the P3I implant is $BF_3$ or $B_2H_6$. In one embodiment, $B_2H_6$ may be preferred for solar cell application since the hydrogen from $B_2H_6$ helps passivate the surface 403 of the silicon solar cell substrate 402 by bonding with the silicon dangling bonds.

Figure 4E:
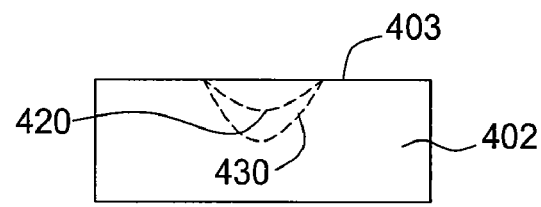
Figure 4F:
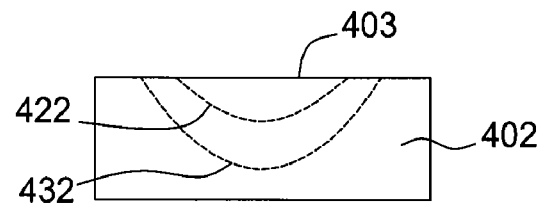

At step 311, as shown in FIGS. 3A and 4E, the physical mask 410 is removed.

At step 312, similar to step 112 of process sequence 100 and discussed previously, an optional capping layer (not shown in FIG. 4E) can be deposited on the surface 403 of the solar cell substrate 402 to prevent loss of dopant from the doped regions during a subsequent annealing step.

At step 314, similar to step 114 of process sequence 100 and discussed previously, the solar cell substrate 402 is annealed, or heated, to a temperature greater than about 800° C. to activate the dopants and drive the dopants deeper into the solar cell substrate 402 to reach the desired regions 422 and 432. The fast-diffusing dopant generally diffuses to a deeper depth than the slow-diffusing dopant.

At step 316, similar to step 116 of process sequence 100 and discussed previously, an optional patterned metallization layer (not shown in FIG. 4F) is deposited on the surface 403 of the solar cell substrate 402 to form buss lines that electrically connect the emitters via the openings 412.

Following the metallization process at step 316, individual solar cells are often electrically connected and encapsulated as a solar module. Solar modules often have a sheet of glass on the front (i.e. light receiving) side, allowing light to pass while protecting the semiconductor wafers from the elements. Solar cells are usually connected in series in modules to create an additive voltage while connecting cells in parallel will yield a higher current. Solar modules are then interconnected, in series or parallel, or both, to create a solar array with the desired peak DC voltage and current.

Figure 7A:
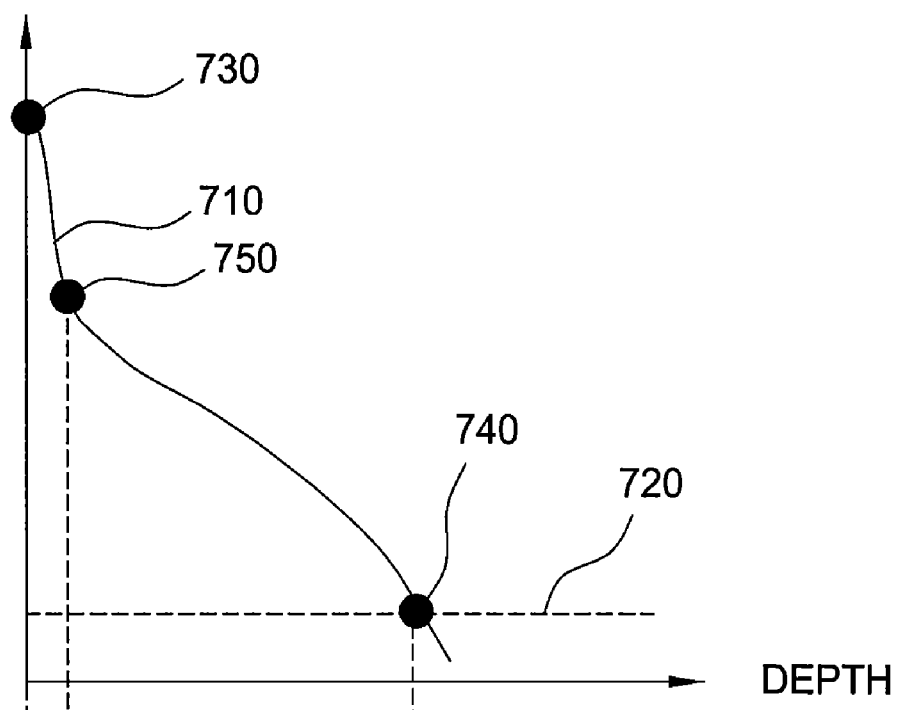
FIGS. 7A-7B illustrate a sample concentration profile of n-type dopants with respect to depth into a p-type solar cell substrate when forming a high-low type emitter with a physical mask according to one embodiment of the invention.
Figure 7B:
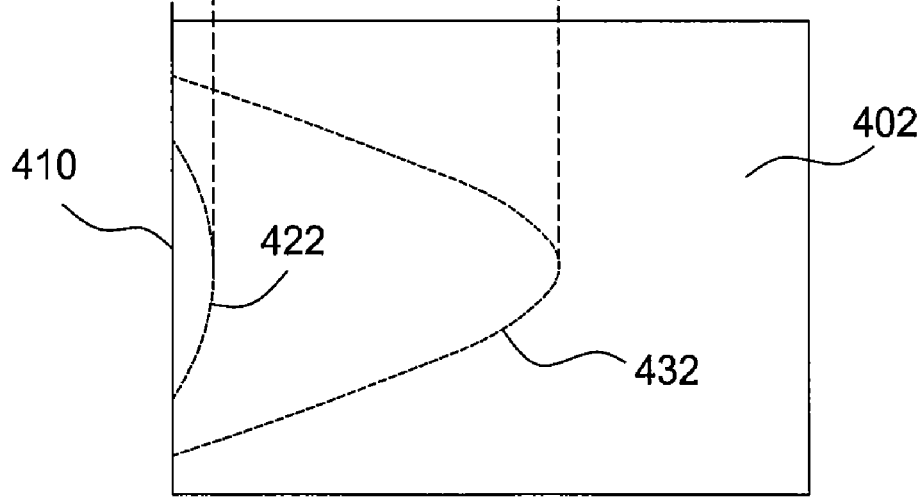

According to one embodiment of the invention, FIG. 7A illustrates a sample concentration profile, denoted by curve 710, of n-type arsenic and phosphorous dopants with respect to depth into a boron-doped p-type solar cell substrate 402, as shown in FIG. 7B, when forming a high-low type emitter with a physical mask as discussed above. FIG. 7B is a side cross-sectional view of a solar cell substrate 402 after steps 302-314 have been performed. Curve 710 illustrates a maximum concentration 730 of an n-type dopant, primarily composed of arsenic, near the surface 403 of the solar cell substrate 402 for making a low resistance contact. At increasing depths into the solar cell substrate, curve 710 illustrates a decreasing n-type dopant concentration. At point 750 on curve 710, the n-type dopant concentration decreases significantly as the doping region transitions from a heavily doped arsenic region to a lightly doped phosphorous region. At point 740 on curve 710, the n-type dopant concentration becomes equivalent to the background doping level 720 of the p-type substrate.

Figure 8:
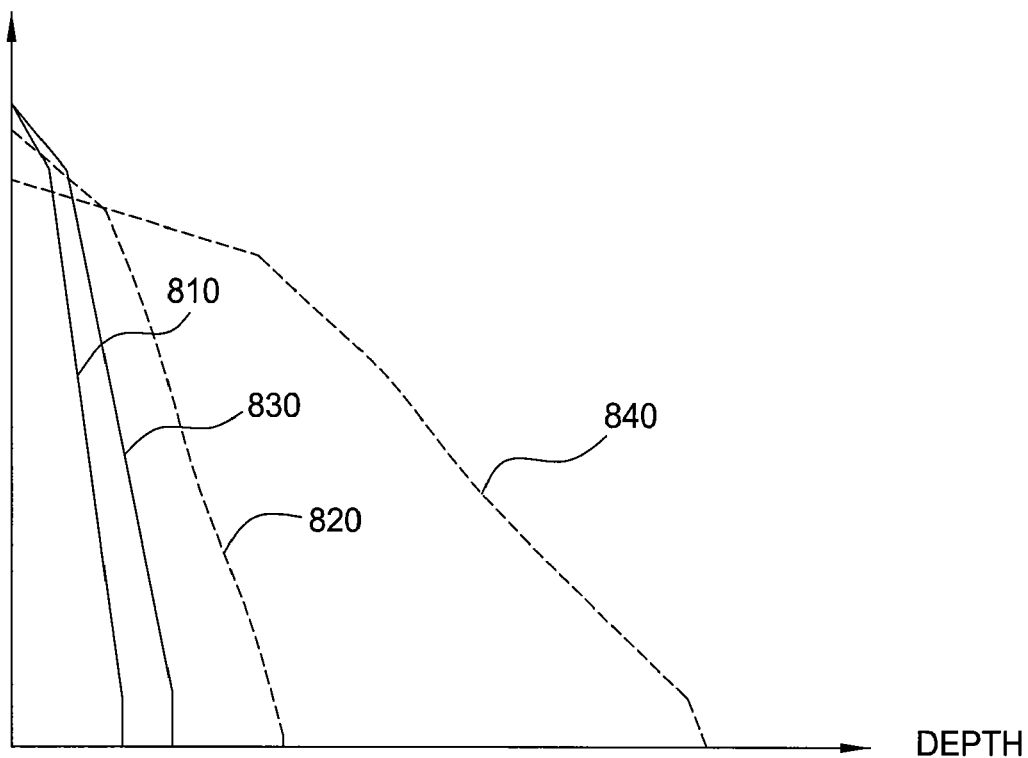
FIG. 8 illustrates sample concentration profiles of an n-type dopant and a p-type dopant before and after the anneal step with respect to depth into a solar cell substrate when forming an alternating doping type emitter with a physical mask according to one embodiment of the invention.

According to one embodiment of the invention, FIG. 8 illustrates sample concentration profiles of an n-type dopant, such as arsenic, and a p-type dopant, such as boron, before and after the anneal step (step 314) with respect to depth into a solar cell substrate when forming an alternating doping type emitter with a physical mask as discussed above. Curves 810 and 820 represent the concentration profiles of an n-type dopant, such as arsenic, before and after anneal, respectively. Curves 830 and 840 represent the concentration profiles of a p-type dopant, such as boron, before and after anneal, respectively. After implant and before anneal, both dopant species are generally concentrated near the surface. After anneal, the slow-diffusing arsenic remains near the surface and the fast-diffusing boron diffuses much deeper into the substrate. This results in a higher concentration of arsenic near the surface of the substrate, forming an n-type region, and a higher concentration of boron deeper into the solar cell substrate, forming a p-type region.

Emitter Formation Using Physical Mask and Dopant Co-Implant

To reduce manufacturing steps in the processing sequence 300 and the associated cost, the process steps 308 and 310 can be replaced with step 309 (FIG. 3B) in which more than one dopant species is co-implanted at the same time. In one embodiment, at step 309 the first dopant and the second dopant can be optionally co-implanted in one step through the openings 412 of the physical mask 410 onto the surface 403 of the solar cell substrate 402. In one embodiment, the concentration of each dopant may be separately controlled through setting of the pressure of the dopant gas in a plasma ion immersion implantation (P3I) system. In the embodiment of forming high-low type emitters, slow-diffusing arsenic is implanted with a dose of about $1 \times 10^{16}/cm^2$, and fast-diffusing phosphorous is implanted with a dose of about $1 \times 10^{14}/cm^2$. In the embodiment of forming alternating doping type emitters, slow-diffusing arsenic is implanted with a dose of about $1 \times 10^{16}/cm^2$, and fast-diffusing boron is implanted with a dose of about $1 \times 10^{14}/cm^2$.

Emitter Formation Using Doped Dielectric

Figure 5:
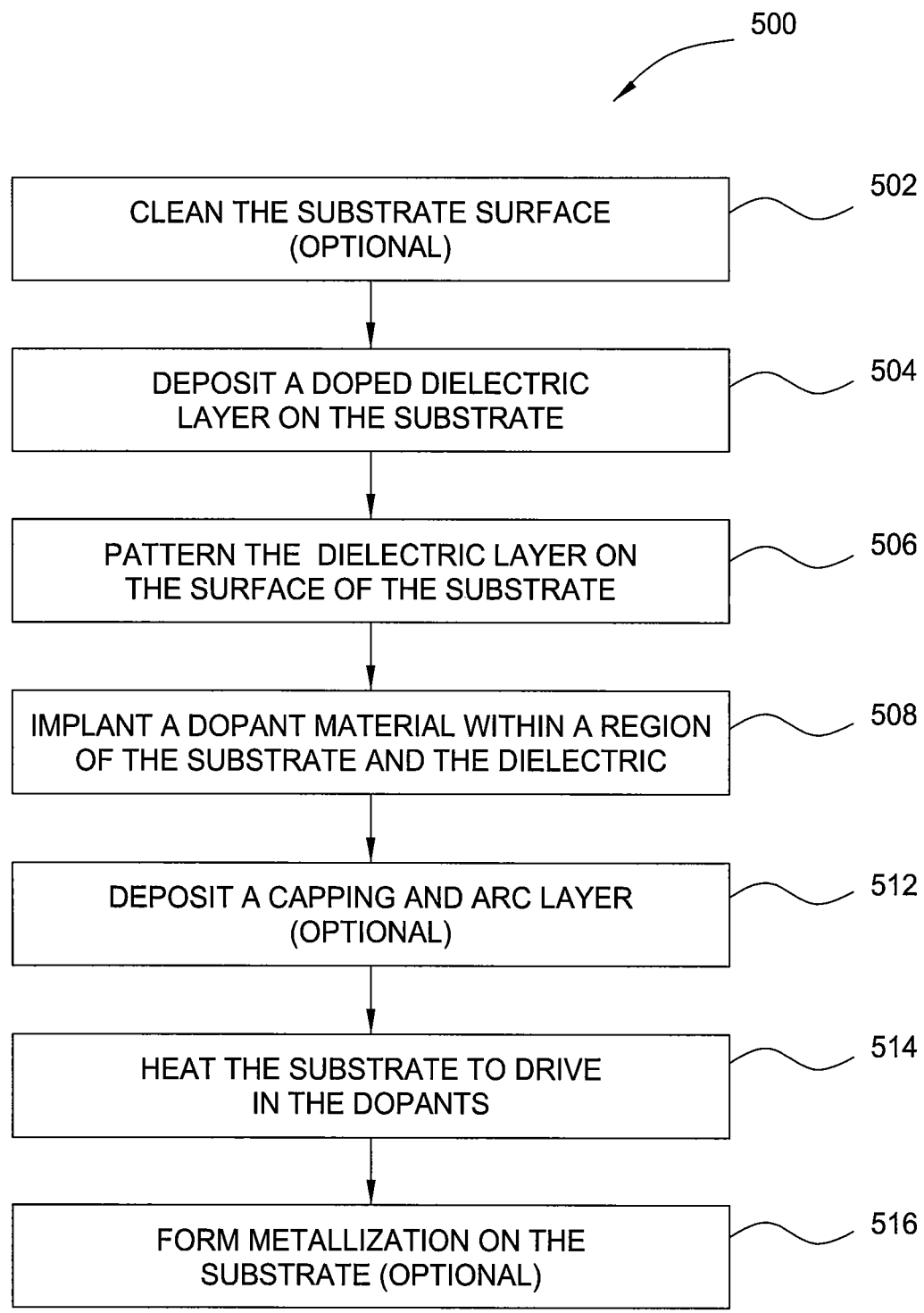
FIG. 5 illustrates a process sequence used to form high-low type emitters or alternating doping type emitters in a solar cell using a doped dielectric layer as a mask and a source of dopant for the substrate according to one embodiment of the invention.

FIG. 5 illustrates a process sequence 500 used to form high-low type emitters or alternating doping type emitters in a solar cell using a doped dielectric layer as a mask as well as a source of a dopant material for the solar cell substrate. FIGS. 6A-6E illustrate schematic cross-sectional views of a solar cell substrate 602 during different stages in the process sequence 500 depicted in FIG. 5. It should be noted that the number and sequence of steps illustrated in FIGS. 5 and 6 are not intended to be limiting as to the scope of the invention described herein, since one or more steps can be added, deleted and/or reordered without deviating from the basic scope of the invention described herein.

In one embodiment, the processes formed at steps 502, 506, 508, 512, 514, and 516 of FIG. 5 are the same or similar to the processes performed at steps 102, 106, 108, 112, 114, and 116 of FIG. 1, respectively. Therefore, at step 502 a process similar to step 102, discussed above, is performed on the solar cell substrate 602. In one embodiment, the solar cell substrate 602 is a crystalline silicon substrate similar to the solar cell substrate 202 discussed above.

Figure 6A:
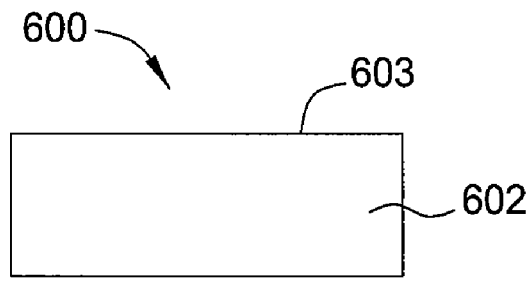
FIGS. 6A-6E illustrate schematic cross-sectional views of a solar cell substrate during different stages in the process sequence depicted in FIG. 5 according to one embodiment of the invention.
Figure 6B:
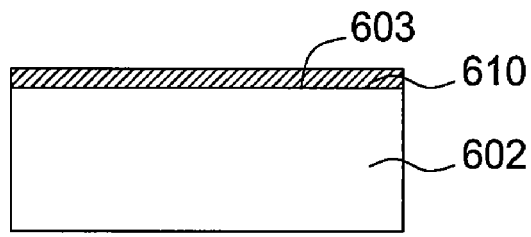

At step 504, as shown in FIGS. 5 and 6B, a doped dielectric layer, or specifically a doped screen dielectric layer 610 is formed on a surface 203 of the solar cell substrate 202. In one embodiment, the solar cell substrate 202 is crystalline silicon, and the doped screen dielectric layer 610 is a phosphorous-doped or boron-doped silicon oxide layer. In one embodiment, the doped screen dielectric layer 610 may be deposited by reacting suitable source gases in a plasma enhanced chemical vapor deposition (PECVD) system or a sub-atmosphere chemical vapor deposition (SA-CVD) system available from Applied Materials, Inc. of Santa Clara, Calif. In one embodiment, gaseous reactants including silane ($SiH_4$), nitrous oxide ($N_2O$), and diborane ($B_2H_6$) are used to deposit a boron-doped silicon oxide layer in a PECVD chamber. In one embodiment, gaseous reactants including tetraethyl orthosilicate (TEOS) in a helium carrier gas, ozone, and diborane ($B_2H_6$) are used to deposit a boron-doped silicon oxide layer in a SA-CVD chamber. In one embodiment, the doped screen dielectric layer 610 is a silicon oxide layer that is between about 50 Å and about 3000 Å thick, for example about 300 Å. It should be noted that the discussion of the formation of a doped silicon oxide type screen dielectric layer is not intended to be limiting as to the scope of the invention described herein since the doped screen dielectric layer 210 could also be formed using any of the conventional deposition processes mentioned above and/or be made of other dielectric materials, for example, silicon carbide ($SiC_x$), silicon nitride ($SiN_x$), or aluminum oxide ($AlO_x$). In the embodiment of the process of forming a standard solar cell, or a high-low type solar cell, the surface 603 is the front, light-receiving surface of the solar cell substrate 602. In the embodiment of the process of forming a point contact type solar cell, or an alternating doping type solar cell, the surface 603 is the back, non-light-receiving surface of the solar cell substrate 602.

Figure 6C:
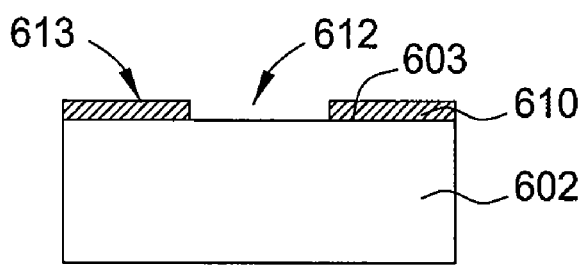

At step 506, as shown in FIGS. 5 and 6C and similar to step 106 of process sequence 100, the doped screen dielectric layer 610 formed on the surface 603 of the solar cell substrate 602 is patterned and then a portion is removed, or etched, by conventional means to form a desired pattern of exposed regions 612 of the solar cell substrate that can be used to define the contacting regions for the metallization to form contacts.

Figure 6D:
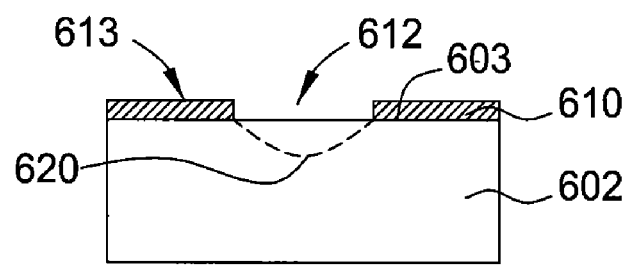

At step 508, as shown in FIGS. 5 and 6D and similar to step 108 of process sequence 100, a first dopant is implanted onto the surface 603 to form a doped region 620 within the solar cell substrate 602.

At step 512, as shown in FIG. 5 and similar to step 112 of process sequence 100, an optional capping layer (not shown in FIG. 6D) can be deposited on the surface 603 of the solar cell substrate 602 to prevent loss of dopant from the doped regions during annealing.

Figure 6E:
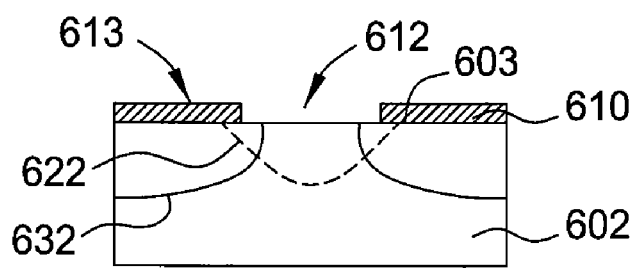

At step 514, as shown in FIGS. 5 and 6E, the solar cell substrate 602 is annealed, or heated, to a temperature greater than about 800° C. to activate the dopants and drive the dopants deeper into the solar cell substrate 602 to reach the doped regions 622 and 632. The anneal process performed during step 514 promotes the dopants originally embedded in the doped dielectric layer 610 to diffuse into the solar cell substrate 602, forming a doped region 632. The anneal process also drives the dopants in the doped region 620 deeper into the solar cell substrate 602 to form a doped region 622. The fast-diffusing dopant generally diffuses to a deeper depth than the slow-diffusing dopant. In one embodiment, the dielectric layer 610 is phosphorous-doped and the slow-diffusing doped region 620 is arsenic doped. Therefore, the doped regions 632 and 622 are the same doping type, forming high-low type emitters. In one embodiment, the dielectric layer 610 is boron-doped and the slow-diffusing doped region 620 is arsenic doped. Therefore, the doped regions 632 and 622 are opposite doping types (a p-type region and an n-type region, respectively), forming alternating doping type emitters.

At step 516, as shown in FIG. 5 and similar to step 116 of process sequence 100, an optional patterned metallization layer (not shown in FIG. 6E) is deposited on the surface 603 of the solar cell substrate 602 to form buss lines that electrically connect the emitters via the exposed regions 612.

Following the metallization process at step 516, individual solar cells are often electrically connected and encapsulated as a solar module. Solar modules often have a sheet of glass on the front (i.e. light receiving) side, allowing light to pass while protecting the semiconductor wafers from the elements. Solar cells are usually connected in series in modules to create an additive voltage while connecting cells in parallel will yield a higher current. Solar modules are then interconnected, in series or parallel, or both, to create a solar array with the desired peak DC voltage and current.

Plasma Processing Chamber

Manufacturing high efficiency solar cells at low cost is key to making solar cells more competitive in the electrical generation industry. In an effort to inexpensively implant one or more doping materials within a solar cell substrate a plasma doping chamber may be used. A plasma doping chamber, such as the plasma ion immersion chamber available from Applied Materials, Inc., is generally less expensive, has a smaller system foot print, is much less complex, and has a lower cost of ownership than conventional ion implantation devices. Unlike most beam-line ion implanters, the wafers sit on an electrical biased horizontal chuck, so many wafers can be implanted in a few seconds. Plasma ion immersion implantation also has the ability to achieve higher dopant dosing levels in a short time versus conventional furnace type diffusion type doping processes.

Figure 9:
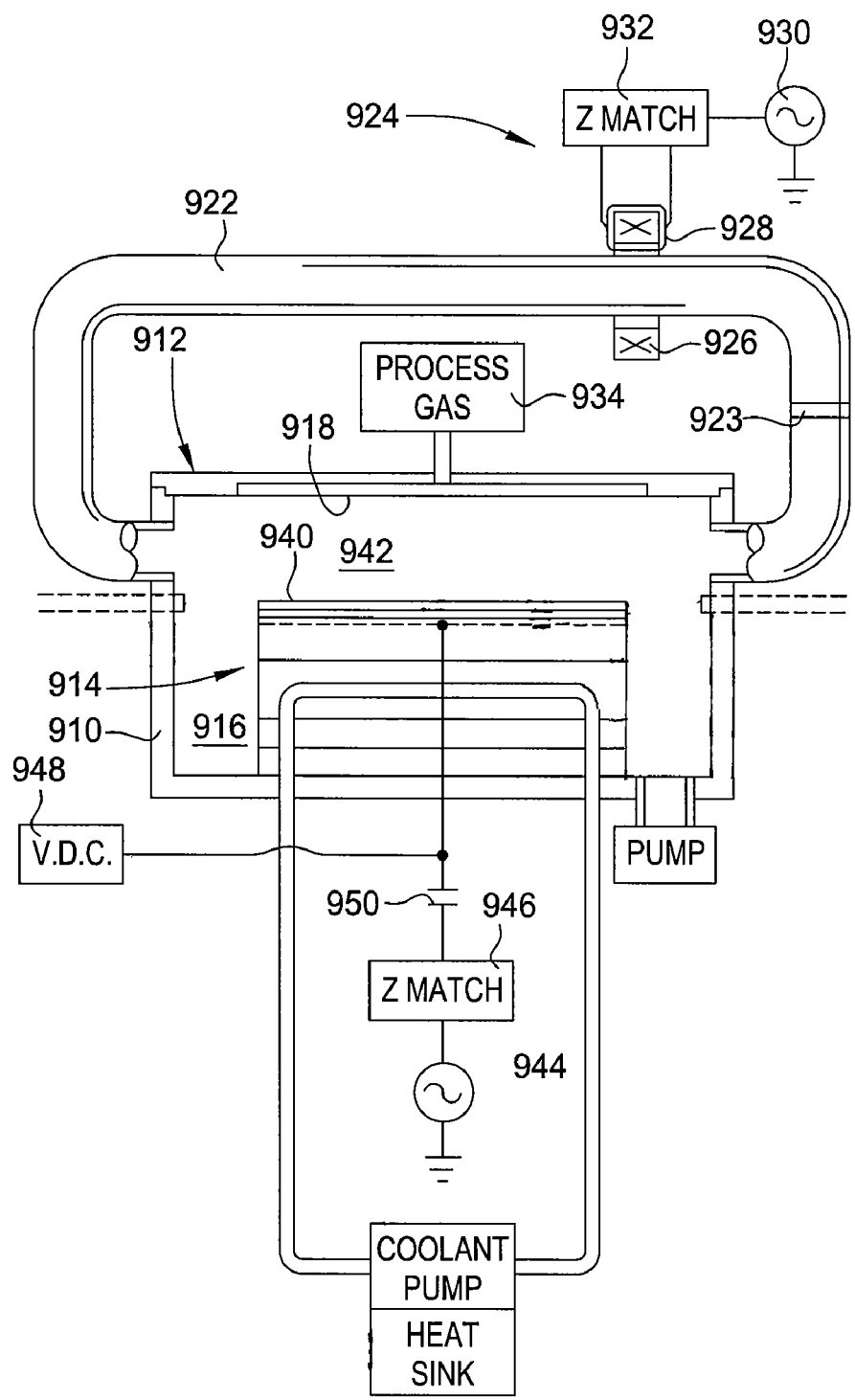
FIG. 9 is a side cross-sectional view of a processing chamber according to one embodiment of the invention.

FIG. 9 illustrates an example of a plasma ion immersion implantation system. In FIG. 9, the plasma reactor has a cylindrical side wall 910, a ceiling 912 and a wafer contact-cooling electrostatic chuck 914. A pumping annulus 916 is defined between the chuck 914 and the sidewall 910. The reactor in the example of FIG. 9 is of the type in which process gases can be introduced through a gas distribution plate 918 (or "showerhead") forming a large portion of the ceiling 912. While the wafer contact-cooling electrostatic chuck 914 may be employed in conjunction with any plasma source (such as an inductively coupled RF plasma source, a capacitively coupled RF plasma source or a microwave plasma source), the reactor in the example of FIG. 9 has a reentrant RF torroidal plasma source consisting of an external reentrant tube 922 coupled to the interior of the reactor through opposite sides of the sidewall 910. In one embodiment, the plasma reactor contains a plurality of torroidal sources (not shown) that are generally symmetrically arranged around the plasma reactor to improve the plasma density, plasma uniformity, and/or plasma process control. An insulating ring 923 provides a D.C. break along the reentrant tube 922. The torroidal plasma source further includes an RF power applicator 924 that may include a magnetically permeable torroidal core 926 surrounding an annular portion of the reentrant tube 922, a conductive coil 928 wound around a portion of the core 926 and an RF plasma source power generator 930 coupled to the conductive coil through an optional impedance match circuit 932. A process gas supply 934 is coupled to the gas distribution plate 918. A semiconductor wafer or workpiece 940 is placed on top of the chuck 914. A processing region 942 is defined between the wafer 940 and the ceiling 912 (including the gas distribution plate 918). A torroidal plasma current oscillates at the frequency of the RF plasma source power generator 930 along a closed torroidal path extending through the reentrant tube 922 and the processing region 942. RF bias power is applied to the chuck 914 by an RF bias power generator 944 through an impedance match circuit 946. A DC chucking voltage is applied to the chuck 914 from a chucking voltage source 948 isolated from the RF bias power generator 944 by an isolation capacitor 950.

In one example, a plasma ion immersion implantation process that may be used to implant boron, phosphorous, or arsenic can include introducing a precursor gas comprising a hydride or a fluoride of a dopant species, striking a plasma using a plasma source power in a two torroidal source conduits configuration between about 50 W and about 2 KW (preferably 500 W) at an RF voltage of 0.3 kV-10 kVpp (preferably 5 kVpp), setting a chamber pressure between about 5 and about 100 mtorr (preferably 20 mtorr), heating a solar cell substrate to a temperature between about 100° C. and about 1000° C. (preferably 600° C.), applying a bias power to the solar cell substrate on the order of 10 W-10 KW to drive the ionized dopant species towards the surface of the solar cell substrate. Examples of plasma ion immersion chamber and process that may be used to perform a plasma doping process are further disclosed in the commonly assigned U.S. Pat. No. 7,320,734, filed Aug. 22, 2003, U.S. Pat. No. 7,288,491, filed Jan. 28, 2005, and U.S. patent application Ser. No. 11/046,660, filed Jan. 28, 2005, which are all incorporated by reference.

While the foregoing is directed to embodiments of the invention, other and further embodiments of the invention may be devised without departing from the basic scope thereof, and the scope thereof is determined by the claims that follow.

What is claimed is:

1. A method of forming a solar cell device, comprising:
depositing a dielectric layer on a substrate;
patterning the dielectric layer to form a mask, thereby forming a pattern of exposed regions of the substrate;
disposing a first amount of a first dopant within the exposed regions of the substrate;
disposing a second amount of a second dopant within the exposed regions of the substrate, the dielectric layer, and the substrate below the dielectric layer after disposing the first dopant within the exposed regions, thereby forming a first doped region and a second doped region within the substrate, wherein the first dopant has a higher atomic mass than the second dopant; and
heating the substrate so that the first dopant diffuses a first depth within the substrate and the second dopant diffuses a second depth within the substrate, wherein the second depth of the second doped region is deeper than the first depth of the first doped region.

2. A method of forming a solar cell device, comprising:
forming a dielectric layer on a surface of a substrate;
removing a portion of the dielectric layer from the surface to expose a portion of the substrate;
disposing a first amount of a first dopant within a region of the substrate which is adjacent to the exposed portion of the substrate;
disposing a second amount of a second dopant within the region of the substrate; and
heating the substrate to cause the first dopant to diffuse a first depth within the substrate and the second dopant to diffuse a second depth within the substrate, wherein the second depth is greater than the first depth.

3. A method of forming a solar cell device, comprising:
positioning a physical mask over a surface of a substrate;
disposing a first dopant into a first region of the substrate through an opening formed in the physical mask;
disposing a second dopant into the region of the substrate through the opening formed in the physical mask; and
heating the substrate to form a second region and a third region, wherein the concentration of the first dopant in the second region is greater than the second dopant concentration, the concentration of the second dopant in the third region is greater than the first dopant concentration, and the second region is closer to the surface of the substrate than the third region.

4. A method of forming a solar cell device, comprising:
depositing a doped dielectric layer on a surface of a substrate, wherein the doped dilectric layer contains a first dopant material;
removing a first region of the doped dielectric layer from the surface to form an opening in the doped dielectric layer and thereby expose a first portion of the substrate;
disposing a second dopant material through the opening in the doped dielectric layer and within the first portion of the substrate which is adjacent to the surface of the substrate;
heating the substrate to cause the first dopant material and the second dopant material to diffuse into the substrate; and
removing a second region of the doped dielectric layer from the substrate to expose a second portion of the substrate.

5. A method of forming a solar cell device, comprising:
depositing a dielectric layer on a substrate;
patterning the dielectric layer to form a mask, thereby forming a pattern of exposed regions of the substrate;
disposing a first amount of a first dopant within the exposed regions of the substrate;
disposing a second amount of a second dopant within the exposed regions of the substrate and the dielectric layer after disposing the first dopant within the exposed regions, thereby forming a first doped region and a second doped region within the substrate, wherein the first dopant has a higher atomic mass than the second dopant; and
heating the substrate so that the first dopant diffuses a first depth within the substrate and the second dopant diffuses a second depth within the substrate, wherein the second depth of the second doped region is deeper than the first depth of the first doped region.

6. The method of claim 1, wherein the first dopant is an opposite doping type than the second dopant.

7. The method of claim 1, wherein the concentration of the first dopant near a surface is greater than about $1\times10^{16}$ atoms/cm$^2$.

8. The method of claim 1, wherein heating the substrate comprises heating the substrate to a temperature greater than about 800° C.

9. The method of claim 1, further comprising depositing a layer on a surface of the substrate, wherein the layer comprises a material selected from a group consisting of silicon nitride, silicon carbide, and aluminum oxide.

10. The method of claim 1, wherein the first dopant is arsenic (As) and the second dopant is phosporous (P) or boron (B).

11. The method of claim 1,
wherein the first and second doped regions have a similar profile.

12. The method of claim 1, wherein disposing the first amount of the first dopant or disposing the second amount of the second dopant within the region of the substrate comprises:
providing a gas containing a dopant material into a processing region of a plasma processing chamber;
generating a plasma in the processing region; and
biasing a substrate support to cause ions generated in the plasma to be disposed in the surface of the substrate.

13. The method of claim 11, wherein the first and second depth are deepest at a point below the exposed regions of the substrate.

14. The method of claim 2, wherein
disposing the first amount of the first dopant further comprises delivering the first dopant to the surface of the substrate at a first energy level; and
forming the dielectric layer further comprises forming a dielectric layer having a thickness large enough to substantially prevent the first dopant from being disposed in the surface of the substrate beneath the formed dielectric layer when the first dopant is delivered at the first energy level.

15. The method of claim 2, wherein the first dopant is an opposite doping type than the second dopant.

16. The method of claim 2, wherein the concentration of the first dopant in the exposed portion of the substrate is greater than about $1\times10^{16}$ atoms/cm$^2$.

17. The method of claim 2, wherein heating the substrate comprises heating the substrate to a temperature greater than about 800° C.

18. The method of claim 2, further comprising depositing a layer on the surface of the substrate, wherein the layer comprises a material selected from a group consisting of silicon nitride, silicon carbide, and aluminum oxide.

19. The method of claim 2, wherein the first dopant is arsenic (As) and the second dopant is phosporous (P) or boron (B).

20. The method of claim 3, wherein first dopant is an opposite doping type than the second dopant.

21. The method of claim 3, wherein the concentration of the first dopant in the exposed portion of the substrate is greater than about $1\times10^{16}$ atoms/cm$^2$.

22. The method of claim 3, wherein heating the substrate comprises heating the substrate to a temperature greater than about 800° C.

23. The method of claim 3, further comprising depositing a layer on the surface of the substrate, wherein the layer comprises a material selected from a group consisting of silicon nitride, silicon carbide, and aluminum oxide.

24. The method of claim 3, wherein the first dopant is arsenic (As) and the second dopant is phosporous (P) or boron (B).

25. The method of claim 4, wherein first dopant is an opposite doping type than the second dopant.

26. The method of claim 4, wherein the concentration of the first dopant in the first region of the substrate is greater than about $1\times10^{16}$ atoms/cm$^2$.

27. The method of claim 4, wherein heating the substrate comprises heating the substrate to a temperature greater than about 800° C.

28. The method of claim 4, further comprising depositing a layer on the surface of the substrate, wherein the layer comprises a material selected from a group consisting of silicon nitride, silicon carbide, and aluminum oxide.

29. The method of claim 4, wherein the first dopant is arsenic (As) and the second dopant is phosporous (P) or boron (B).

30. The method of claim 24, further comprising depositing a metal over the exposed first portion and the exposed second portion of the substrate.

* * * * *